(12) United States Patent
Ganapathi et al.

(10) Patent No.: US 10,548,034 B2
(45) Date of Patent: Jan. 28, 2020

(54) DATA DRIVEN EMULATION OF APPLICATION PERFORMANCE ON SIMULATED WIRELESS NETWORKS

(71) Applicant: salesforce.com, inc., San Francisco, CA (US)

(72) Inventors: Tejaswini Ganapathi, San Francisco, CA (US); Satish Raghunath, Sunnyvale, CA (US); Shauli Gal, Mountain View, CA (US); Kartikeya Chandrayana, San Francisco, CA (US); Xu Che, San Mateo, CA (US); Andrey Karapetov, San Ramon, CA (US)

(73) Assignee: salesforce.com, inc., San Francisco, CA (US)

( * ) Notice: Subject to any disclaimer, the term of this patent is extended or adjusted under 35 U.S.C. 154(b) by 52 days.

(21) Appl. No.: 15/803,509

(22) Filed: Nov. 3, 2017

(65) Prior Publication Data
US 2019/0141549 A1    May 9, 2019

(51) Int. Cl.
*H04W 24/02* (2009.01)
*H04W 24/06* (2009.01)
*G06F 17/18* (2006.01)
*H04L 12/26* (2006.01)
*H04W 84/04* (2009.01)

(52) U.S. Cl.
CPC ............ *H04W 24/06* (2013.01); *G06F 17/18* (2013.01); *H04W 24/02* (2013.01); *H04L 43/04* (2013.01); *H04L 43/50* (2013.01); *H04W 84/042* (2013.01)

(58) Field of Classification Search
CPC ... H04W 24/02; H04W 24/06; H04W 84/042; H04L 43/04; H04L 43/50; G06F 17/18
See application file for complete search history.

(56) References Cited

U.S. PATENT DOCUMENTS

| | | | |
|---|---|---|---|
| 8,832,249 B2* | 9/2014 | Kuo | G06F 9/5011 709/223 |
| 9,774,616 B2* | 9/2017 | Flores | H04L 63/1433 |
| 9,875,174 B1* | 1/2018 | Brandwine | G06F 11/3664 |
| 9,973,473 B2* | 5/2018 | White | H04L 63/0245 |
| 10,033,766 B2* | 7/2018 | Gupta | H04L 63/20 |
| 10,177,998 B2* | 1/2019 | Parandehgheibi | H04L 63/1425 |
| 10,230,597 B2* | 3/2019 | Parandehgheibi | H04L 63/1425 |
| 2016/0105333 A1* | 4/2016 | Lenglet | H04L 43/024 370/252 |
| 2017/0250869 A1* | 8/2017 | Voellmy | H04L 41/0893 |
| 2018/0011955 A1* | 1/2018 | Gintis | H04L 43/14 |
| 2018/0131586 A1* | 5/2018 | Ciodaru | H04L 43/062 |

* cited by examiner

*Primary Examiner* — Alpus Hsu
(74) *Attorney, Agent, or Firm* — Wong & Rees LLP; Kirk D. Wong

(57) ABSTRACT

A data driven approach to emulating application performance is presented. By retrieving historical network traffic data, probabilistic models are generated to simulate wireless networks. Optimal distribution families for network values are determined. Performance data is captured from applications operating on simulated user devices operating on a virtual machine with a network simulator running sampled tuple values.

20 Claims, 6 Drawing Sheets

DATA DRIVEN EMULATION OF APPLICATION PERFORMANCE ON SIMULATED WIRELESS NETWORKS

TECHNOLOGY

The present invention relates generally to simulating optimized network policies in content delivery, and in particular, to emulating application performance on a simulated wireless network using a probabilistic data-driven approach.

BACKGROUND

Cellular networks are very volatile and diverse. Due to the nature of the wireless channel, link conditions change at a fine timescale. Metrics such as latency, jitter, throughput, and losses are hard to bound or predict. The diversity comes from the various network technologies, plethora of devices, platforms, and operating systems in use.

Techniques that rely on compression or right-sizing content do not address the fundamental issues of network volatility and diversity as they impact the transport of data. Irrespective of the savings in compression, the data still has to weather the vagaries of the network, operating environment, and end device.

Transmission Control Protocol (TCP) plays an important role in the content delivery business: it provides a reliable, ordered, and error-checked delivery of a stream of octets between applications running on hosts communicating by an IP network. Major Internet applications, such as the World Wide Web, email, remote administration, and file transfer, rely on TCP. Numerous parameters may be used in TCP to help in ordered data transfer, retransmission of lost packets, error-free data transfer, flow control, and congestion control. However, identifying an optimal data value for a single TCP parameter based on changing network characteristics remains a challenge. Testing performance of an application to replicate network quality without using real network traffic data also remains a challenge.

The approaches described in this section are approaches that could be pursued, but not necessarily approaches that have been previously conceived or pursued. Therefore, unless otherwise indicated, it should not be assumed that any of the approaches described in this section qualify as prior art merely by virtue of their inclusion in this section. Similarly, issues identified with respect to one or more approaches should not assume to have been recognized in any prior art on the basis of this section, unless otherwise indicated.

BRIEF DESCRIPTION OF DRAWINGS

The present invention is illustrated by way of example, and not by way of limitation, in the figures of the accompanying drawings and in which like reference numerals refer to similar elements and in which.

DESCRIPTION OF EXAMPLE EMBODIMENTS

Figure 1A:
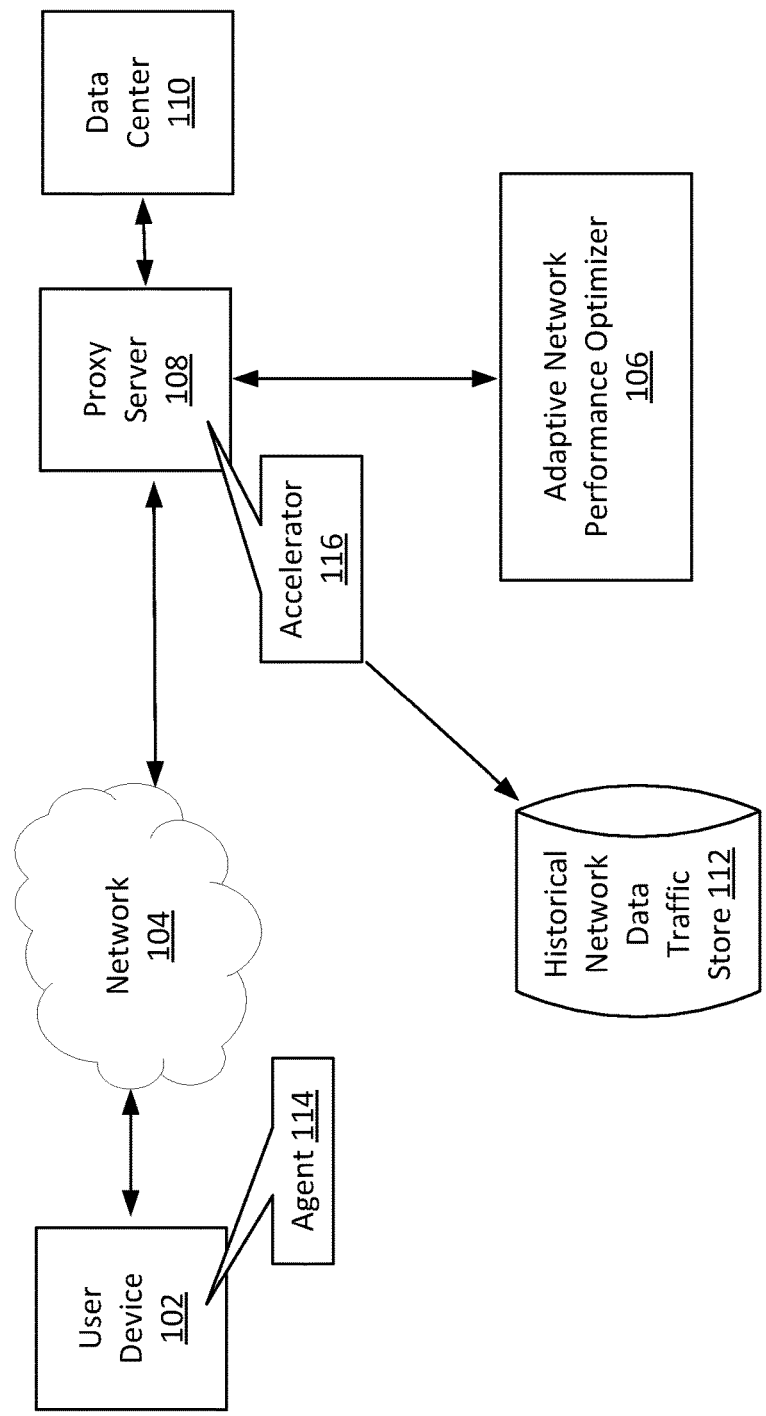
FIG. 1A illustrates a high-level block diagram, including an example historical network data traffic store, according to an embodiment of the invention.

Example embodiments, which relate to cognitive analysis of network performance data, are described herein. In the following description, for the purposes of explanation, numerous specific details are set forth in order to provide a thorough understanding of the present invention. It will be apparent, however, that the present invention may be practiced without these specific details. In other instances, well-known structures and devices are not described in exhaustive detail, in order to avoid unnecessarily occluding, obscuring, or obfuscating the present invention.

Example embodiments are described herein according to the following outline:

1. GENERAL OVERVIEW
2. PROBABILISTIC MODELING OF HISTORICAL NETWORK TRAFFIC DATA TO SIMULATE WIRELESS NETWORKS
3. WIRELESS NETWORK SIMULATION
4. EMULATING APPLICATION PERFORMANCE WITH SIMULATED WIRELESS NETWORKS
5. IMPLEMENTATION MECHANISMS—HARDWARE OVERVIEW
6. EQUIVALENTS, EXTENSIONS, ALTERNATIVES AND MISCELLANEOUS

1. General Overview

This overview presents a basic description of some aspects of an embodiment of the present invention. It should be noted that this overview is not an extensive or exhaustive summary of aspects of the embodiment. Moreover, it should be noted that this overview is not intended to be understood as identifying any particularly significant aspects or elements of the embodiment, nor as delineating any scope of the embodiment in particular, nor the invention in general. This overview merely presents some concepts that relate to the example embodiment in a condensed and simplified format, and should be understood as merely a conceptual prelude to a more detailed description of example embodiments that follows below.

Modern data transport networks feature a huge variety of network technologies, end-user devices, and software. Some of the common network technologies include cellular networks (e.g., LTE, HSPA, 3G, older technologies, etc.), WiFi (e.g., 802.11xx series of standards, etc.), satellite, microwave, etc. In terms of devices and software, there are smartphones, tablets, personal computers, network-connected appliances, electronics, etc., that rely on a range of embedded software systems such as Apple iOS, Google Android, Linux, and several other specialized operating systems. There are certain shared characteristics that impact data delivery performance:

a. Many of these network technologies feature a volatile wireless last mile. The volatility manifests itself in the application layer in the form of variable bandwidth, latency, jitter, loss rates and other network related impairments.

b. The diversity in devices, operating system software and form factors results in a unique challenge from the perspective of user experience.

c. The nature of content that is generated and consumed on these devices is quite different from what was observed with devices on the wired Internet. The new content is very dynamic and personalized (e.g., adapted to location, end-user, other context sensitive parameters, etc.).

A consequence of these characteristics is that end-users and applications experience inconsistent and poor performance. This is because most network mechanisms today are not equipped to tackle this new nature of the content generated and consumed. In terms of the transport, today's client and server software systems are best deployed in a stable operating environment where operational parameters either change a little or do not change at all. When such software systems see unusual network feedback they tend to over-react in terms of remedies. From the perspective of infrastructure elements in the network that are entrusted with optimizations, current techniques like caching, right sizing, and compression fail to deliver the expected gains. The dynamic and personalized nature of traffic leads to low cache hit-rates and encrypted traffic streams that carry personalized data make content modification much harder and more expensive. Specifically, testing out infrastructure elements that are created for optimizing network performance requires a realistic operating environment. Using a virtual machine with a network simulator to replicate an operating environment, as described herein, solves this problem of replicating dynamic and personalized network traffic data that improves the efficiency and operation of the overall system.

Modern heterogeneous networks feature unique challenges that are not addressed by technologies today. Unlike the wired Internet where there was a stable operating environment and predictable end device characteristics, modern heterogeneous networks require a new approach to optimize data delivery. To maximize improvement in throughput gain and download complete time, TCP parameters may be estimated using a data driven approach by analyzing prior wireless network traffic data. Because wireless networks are volatile and non-stationary (e.g., statistics change with time, etc.), estimating TCP parameters poses several challenges. The estimate should be adaptive to capture volatilities in the wireless network, but also be stable and not overly sensitive to short term fluctuations. Further, raw network traffic data does not capture the performance in improvement of throughput and download complete time of a particular set of TCP parameters. Methods and techniques described herein create simulated wireless networks by using probabilistic models of historical data for testing and emulating application performance.

Various modifications to the preferred embodiments and the generic principles and features described herein will be readily apparent to those skilled in the art. Thus, the disclosure is not intended to be limited to the embodiments shown, but is to be accorded the widest scope consistent with the principles and features described herein.

2. Probabilistic Modeling of Historical Network Traffic Data to Simulate Wireless Networks The performance of data delivery is closely tied to the operating conditions within which the end-device is operating. With ubiquitous wireless access over cellular and WiFi networks, there is a lot of volatility in operating conditions, so acceleration techniques must adapt to such a network by adapting to these conditions, e.g., the performance achievable over a private WiFi hotspot is very different from that with a cellular data connection. An accelerator 116, as illustrated in FIG. 1, dynamically adapts to these conditions and picks the best strategies based on the context.

The context captures the information about the operating conditions in which data transfer requests are being made. This includes, but is not limited to, any combination of:

Type of device, e.g., iPhone, iPad, Blackberry, etc.
  This may also include the version of the device and manufacturer information.
Device characteristics, e.g., the type of its modem, CPU/GPU, encryption hardware, battery, NFC (Near Field Communication) chipset, memory size and type or any other hardware information that impacts performance
Mobility of device, e.g., whether the device is on a moving vehicle/train etc., or is stationary/semi-stationary.
Operating System on the device.
Operating System characteristics, e.g., buffering, timers, public and hidden operating system facilities (APIs), etc.
  This may also include operating system limitations such as number of simultaneous connections allowed to a single domain, etc.
Usage information related to various device elements, e.g., Memory, Storage, CPU/GPU etc.
Battery charge and mode of powering the device.
Time of day.
Location where available.
IP Address and port numbers.
Network type, e.g., WiFi or Cellular, or 3G/4G/LTE, etc., or Public/Home WiFi, etc.
  SSID (Service Set Identifier) in WiFi networks.
  802.11 network type for WiFi networks.
Service Provider information, e.g., AT&T or Verizon for cellular, Time Warner or Comcast for WiFi, etc.
Strength of signal from the access point (e.g., Wi-Fi hot spot, cellular tower, etc.) for both upstream and downstream direction.
Cell-Tower or Hot-Spot identifier in any form.
Number of sectors in the cell tower or hot spot.
Spectrum allocated to each cell tower and/or sector.
Any software or hardware limitation placed on the hot-spot/cell tower.
Any information on the network elements in the path of traffic from device to the content server.
Firewall Policy rules, if available.
Any active measurements on the device, e.g., techniques that measure one-way delay between web-server and device, bandwidth, jitter, etc.
Medium of request, e.g., native app, hybrid app, web-browser, etc.
  Other information describing the medium, e.g., web browser type (e.g., Safari, Chrome, Firefox etc.), application name, etc.
Any other third party software that is installed on the device that impacts data delivery performance.
Content Type, e.g., image, video, text, email, etc.
  Also may include the nature of content if it is dynamic or static.
Content Location, e.g., coming from origin server or being served from a CDN (Content Delivery Network). In the case of a CDN, any optimization strategies being employed, if available.

Recent device performance statistics, e.g., dropped packets, bytes transferred, connections initiated, persistent/on-going connections, active memory, hard disk space available, etc.

Caching strategies if any, that are available or in use on the device or by the application requesting the content.

In the case of content, where multiple objects have to be fetched to completely display the content, the order in which requests are placed and the order in which objects are delivered to the device. The request method for each of these objects is also of interest.

Based on the operating context, a cognitive engine, as discussed below, may be able to recommend, but is not limited to, any combination of: end-device based data delivery strategies and accelerator-based data delivery strategies.

End-device based data delivery strategies refer to methods deployed by an application (an application could be natively running on the end-device operating system, or running in some form of a hybrid or embedded environment, e.g., within a browser, etc.) to request, receive or, transmit data over the network. These data delivery strategies include, but are not limited to, any combination of:

Methods used to query the location of service point, e.g., DNS, etc.
  This may involve strategies that include, but are not limited to, any combination of: choosing the best DNS servers based on response times, DNS prefetching, DNS refreshing/caching, etc.
Protocols available for data transport, e.g., UDP, TCP, SCTP, RDP, ROHC, etc.
Methods to request or send data as provided by the operating system, e.g., sockets, CFHTTP or NSURL-Connection in Apple's iOS, HttpUrlConnection in Google's Android, etc.
Session oriented protocols available for requests, e.g., HTTP, HTTPS, FTP, RTP, Telnet, etc.
Full duplex communication over data transport protocols, e.g., SPDY, Websockets, etc.
Caching and or storage support provided in the Operating System.
Compression, right sizing or other support in the devices to help reduce size of data communication.
Transaction priorities which outline the order in which network transactions to be completed:
  E.g., this may be a list of transactions where the priority scheme is simply a random ordering of objects to be downloaded.
Content specific data delivery mechanisms, e.g., HTTP Live Streaming, DASH, Multicast, etc.
Encryption support in the device:
  Also includes secure transport mechanisms, e.g., SSL, TLS, etc.
VPN (Virtual Private Network) of any kind where available and/or configured on the device.
Any tunneling protocol support available or in use on the device.
Ability to use or influence rules on the device which dictate how the data needs to be accessed or requested or delivered.
  This includes, but is not limited to, any combination of: firewall rules, policies configured to reduce data usage, etc.
Ability to pick the radio technology to use to get/send data. For example, if allowed, the ability to choose cellular network to get some data instead of using a public Wi-Fi network.
Ability to run data requests or process data in the background.
Threading, locking, and queuing support in the Operating System.
Ability to modify radio power if available.
Presence and/or availability of any error correction scheme in the device.
In cases where middle boxes in the network infrastructure have adverse impact on performance, capabilities on the end-device to deploy mitigations such as encrypted network layer streams (e.g. IPSec, etc.).

A range of parameters determines the performance of tasks such as data delivery. With volatility and diversity, there is an explosion in the number of parameters that may be significant. By isolating parameters, significant acceleration of data delivery may be achieved. Networks, devices and content are constantly changing. Various methods of optimizing data delivery are described in U.S. Pat. No. 9,544,205, entitled "Cognitive Data Delivery Optimizing System," issued on Jan. 10, 2017, and which is hereby incorporated by reference in its entirety for all purposes. Various methods of adaptive parameter estimation and optimization are described in U.S. Pat. No. 10,205,634, entitled "Adaptive Multi-Phase Network Policy Optimization," issued on Feb. 12, 2019, and which is hereby incorporated by reference in its entirety for all purposes. Embodiments are not tied down by assumptions on the current nature of the system. A wireless network modeler 118 may use historical network traffic data to simulate a wireless network using probabilistic models. An application performance emulator 140 generates a virtual machine using a network simulator running on sampled network parameters used to emulate performance of an application.

FIG. 1A and the other figures use like reference numerals to identify like elements. A letter after a reference numeral, such as "102a," indicates that the text refers specifically to the element having that particular reference numeral. A reference numeral in the text without a following letter, such as "102," refers to any or all of the elements in the figures bearing that reference numeral (e.g. "102" in the text refers to reference numerals "102a," and/or "102b" in the figures). Only one user device 102 (end-devices as described above) is shown in FIG. 1 in order to simplify and clarify the description.

As illustrated in FIG. 1*a*, a system 100 includes a user device 102 that communicates data requests through a network 104. A proxy server 108 may receive the data requests and communicate the requests to a data center 110. The adaptive network performance optimizer 106 may gather information from the proxy server 108 and store information in the historical network data traffic store 112, in an embodiment. For example, with a priori knowledge of the possible parameter space of the TCP parameters, a range of values in the space may be set for each TCP parameter. Then, over time, mobile network traffic may be assigned parameters from this space at random and performance data may be stored in the historical network data traffic store 112. The mobile network traffic data may be stored as static policy data in the historical network data traffic store 112. A subset of the traffic may be performed with default TCP parameters of the carrier and data about that traffic may be stored as bypass traffic data.

Each database record in the historical network data traffic store 112 may include performance metrics comparing the static policy data against the bypass traffic data. For example, data representing outcomes of the download such as the throughput, download complete time, and time to first byte, may be captured in each database record in the historical network data traffic store 112 for each static policy. Performance metrics such as percentage improvement in throughput and download complete time of the policy applied compared to the bypass traffic may also be stored in the historical network data traffic store 112, in one embodiment.

Other information may also be included in each database record, in other embodiments. Typical sources of data relating to the network environment are elements in the network infrastructure that gather statistics about transit traffic and user devices that connect to the network as clients or servers. The data that can be gathered includes, but is not limited to, any combination of: data pertaining to requests for objects, periodic monitoring of network elements (which may include inputs from external source(s) as well as results from active probing), exceptional events (e.g., unpredictable, rare occurrences, etc.), data pertaining to the devices originating or servicing requests, data pertaining to the applications associated with the requests, data associated with the networking stack on any of the devices/elements that are in the path of the request or available from any external source, etc.

In an embodiment, a component may be installed in the user device 102 (agent 114) that provides inputs about the real-time operating conditions, participates and performs active network measurements, and executes recommended strategies. The agent 114 may be supplied in a software development kit (SDK) and is installed on the user device 102 when an application that includes the SDK is installed on the user device 102. By inserting an agent 114 in the user device 102 to report the observed networking conditions back to the accelerator 116, estimates about the state of the network can be vastly improved. The main benefits of having a presence (the agent 114) on the user device 102 include the ability to perform measurements that characterize one leg of the session, e.g., measuring just the client-to-server leg latency, etc.

An accelerator 116 sits in the path of the data traffic within a proxy server 108 and executes recommended strategies in addition to gathering and measuring network-related information in real-time. The accelerator 116 may propagate network policies from the adaptive network performance optimizer 106 to the proxy server 108, in one embodiment. In another embodiment, the agent 114 may implement one or more network policies from the adaptive network performance optimizer 106. For example, the optimal number of simultaneous network connections may be propagated as a network policy from the adaptive network performance optimizer 106 through the network 104 to the agent 114 embedded on the user device 102. As another example, the transmission rate of file transfer may be limited to 20 MB/sec by the accelerator 116 as a network policy propagated by the adaptive network performance optimizer 106 based on supervised learning and performance metrics. Here, the term "supervised learning" is defined as providing datasets to train a machine to get desired outputs as opposed to "unsupervised learning" where no datasets are provided and data is clustered into classes.

Figure 1B:
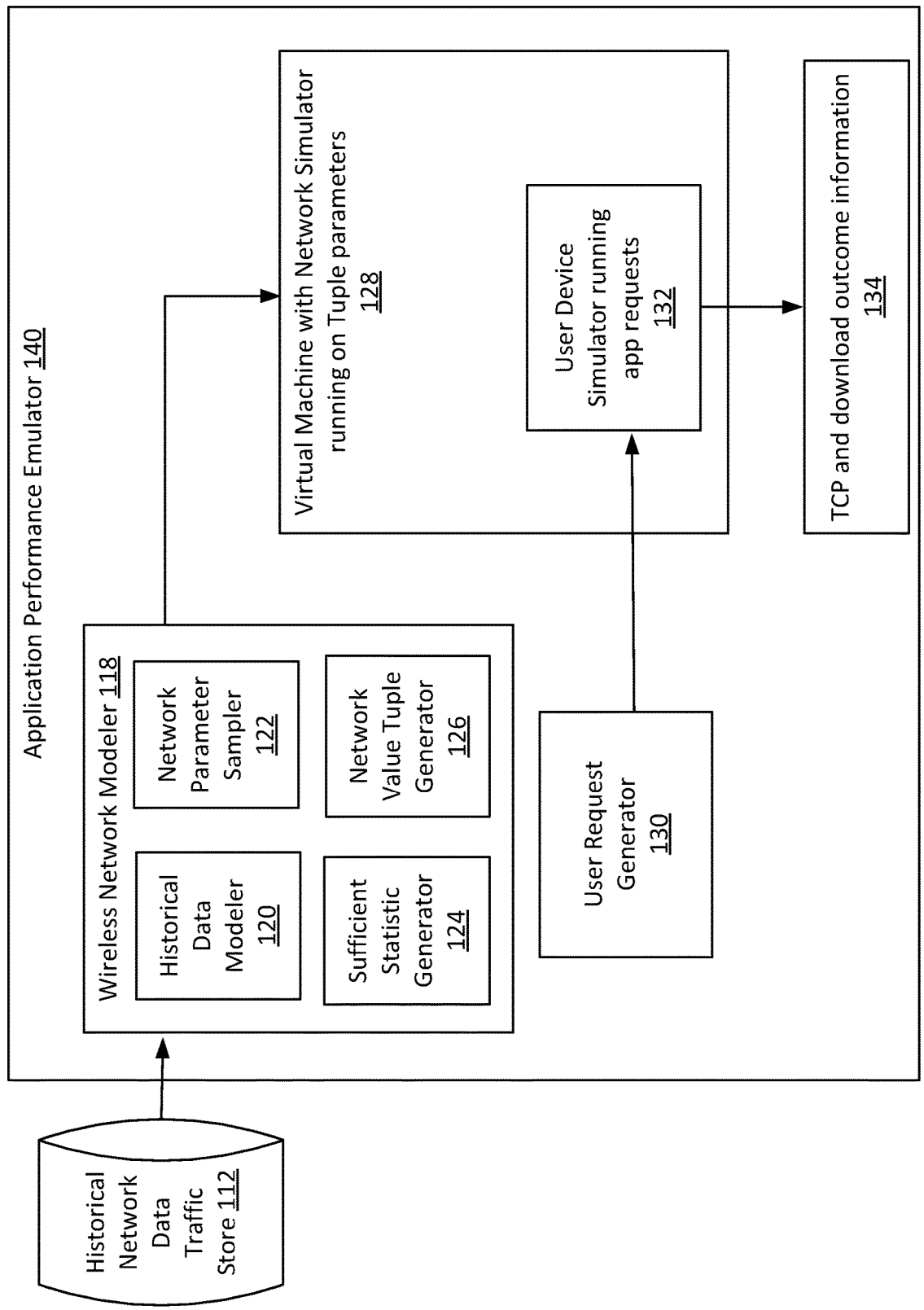
FIG. 1B illustrates a high-level block diagram, according to an embodiment of the invention.

Once a multitude of raw network traffic data associated with data requests between user devices 102 and the data centers 110 are logged in the historical network data traffic store 112, it becomes possible to simulate wireless networks using probabilistic models. As illustrated in FIG. 1B, an application performance emulator 140 includes a wireless network modeler 118 that further includes a historical data modeler 120, a network parameter sampler 122, a sufficient statistic generator 124, and a network value tuple generator 126. Given a database schema of historical data (or information to be mined from historical data) from the historical network data traffic store 112, the data fields can be classified into independent data segmentation fields such as application (app), geography, and network type. The "app" field may refer to a unique identifier that identifies an application being optimized and/or evaluated. The "geography" field may refer to a set of values that refer to different geographic regions. The geographic regions may vary in size. The "network type" field may include values such as "WiFi," "HSPA," "3G", and "LTE", for example. Historical data may further be classified or segmented by file content of the request (such as content type and file size), network fields (such as round trip time), TCP parameters (upon availability), and download outcomes (such as time to download first byte, total download complete time, and download throughput). In some embodiments, a download outcome is a function of other download outcomes.

For example, probabilistic modeling on historical network traffic data may be used to simulate wireless networks such that a virtual machine running the application on the simulated networks may generate outcomes of the download, such as the throughput, download complete time, and time to first byte, during a specified time period. This period of time, or time window, is a parameter on which to segment data (in addition to app, network type, and geography). The historical data may be retrieved for multiple segments parameterized by {app, network type, geography, time window}. A schematic database or dataframe where each row is a network request characterized by time, content, network, and download outcome information is generated by the network parameter sampler 122. For each data segment, probabilistic modelling of historical data is performed by a historical data modeler 120. Sufficient statistics of resultant probability distribution function are calculated by a sufficient statistic generator 124. For each combination of app, network type, geography, content type and size, download outcome information is generated based on probabilistic modelling and a priori constraints using the network value tuple generator 126 among other methods and techniques of the wireless network modeler 118. Although FIG. 1 illustrates the historical data modeler 120 and sufficient statistic generator 124 as separate high-level block processes, one skilled in the art may understand that the functions may exist in one process, in various embodiments.

Policies are generated by the adaptive network performance optimizer 106 for use on an application being tested and/or optimized for network performance. The adaptive network performance optimizer 106 may communicate with the proxy server 108 to identify optimal network parameters for various applications over time using a machine learning solution. New applications being developed may be tested and further optimized using virtual machines on a simulated network running sampled tuple parameters instead of being tested on live data.

As further illustrated in FIG. 1B, the application performance emulator 140 generates TCP and download outcome information 134 based on app performance within a virtual machine 128 operating in a simulated network based on the sampled network parameters, such as network type, geography, and other fields (such as content type, size, time window, etc.). A user device simulator 132 running app requests received from a user request generator 130 may run the application to produce emulated performance data. A user request generator 130 may include a script of typical user requests, in an embodiment, as drafted by administrators of the system 100. In this way, the performance of the application is tested in a simulated wireless network environment that is highly representative of live network environments and may be further improved without releasing the application to live networks.

3. Wireless Network Simulation

Figure 2:
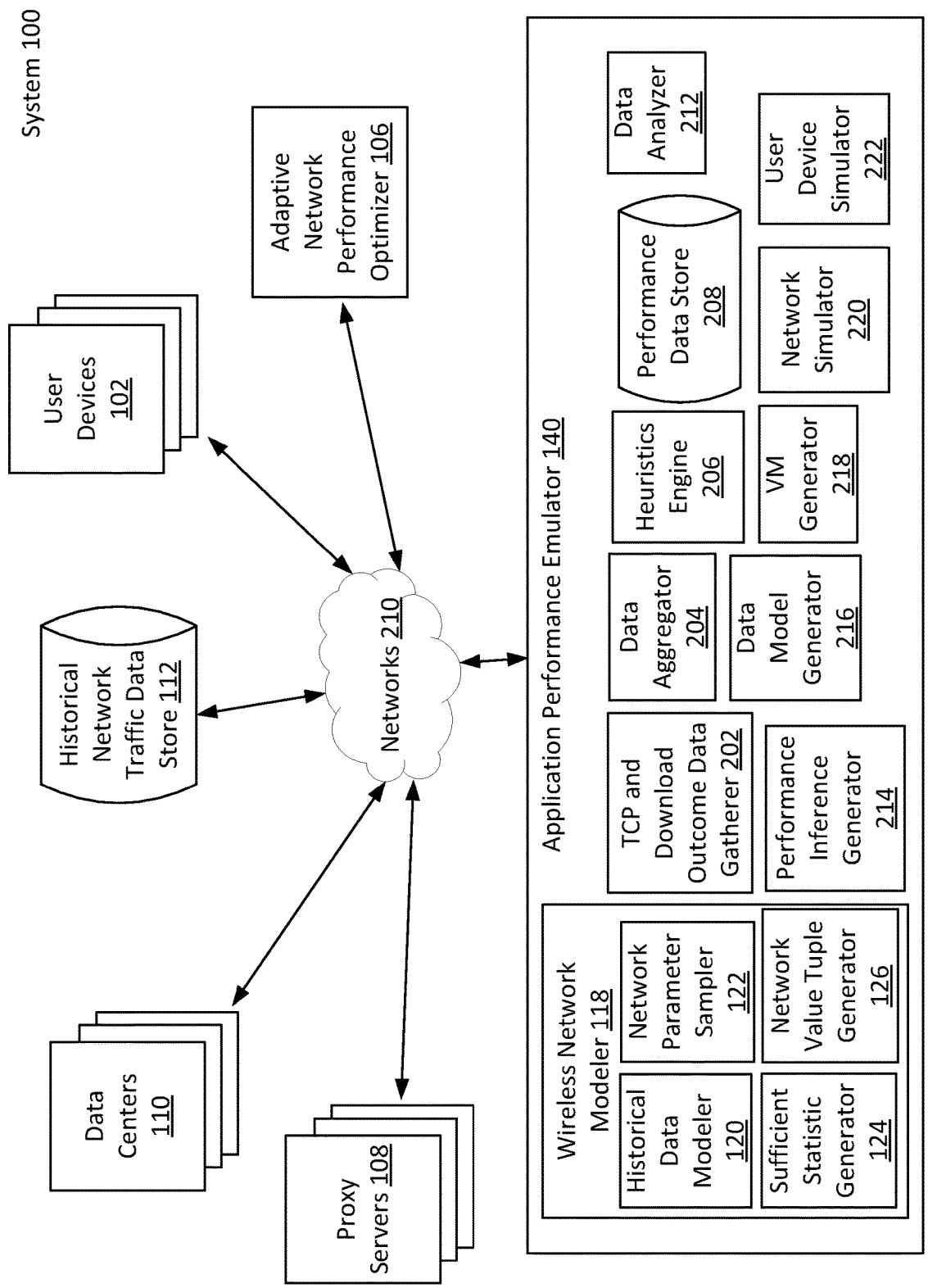
FIG. 2 illustrates a high-level block diagram, including an example application performance emulator according to an embodiment of the invention.

FIG. 2 illustrates a high-level block diagram, including an example application performance emulator 140, according to an embodiment. An application performance emulator 140 includes a wireless network modeler 118 that further includes a historical data modeler 120, a network parameter sampler 122, a sufficient statistic generator 124, and a network value tuple generator 126, in one embodiment. The application performance emulator 140 may further include a TCP and download outcome data gatherer 202, a data aggregator 204, a heuristics engine 206, a performance data store 208, a data analyzer 212, a performance inference generator 214, a data model generator 216, a virtual machine (VM) generator 218, a network simulator 220, and a user device simulator 222 in one embodiment. The application performance emulator 140 may communicate data over one or more networks 210 with other elements of system 100, such as user devices 102, one or more proxy servers 108, data centers 110, one or more historical network traffic data stores 112 and the adaptive network performance optimizer 106.

A wireless network modeler 118 may use a data-driven approach to simulating wireless networks. A historical data modeler 120 is used to determine probabilistic modeling of historical data. This includes classifying historical data into data segmentation fields, file content of the request, network fields, TCP parameters and download outcomes. Given a set of probability distribution function families, F, where $f_i$ is an element of F and $S_i$ is the sufficient statistics vector corresponding to each $f_i$, the historical data modeler 120 estimates, for each $f_i$, the sufficient statistics of $S_i^*$ that maximizes the likelihood of the data using the following formula:

$$S_i^* = \mathrm{argmax}_{Si} \log P(D_{hist}|f_i(S_i))$$

where P( ) is the probability operator and $D_{hist}$ is the historical data.

After estimating the optimal sufficient statistics for each distribution family using a sufficient statistic generator 124, the optimal distribution family and sufficient statistics may be computed by solving the following optimization formulization:

$$f(S) = \mathrm{argmin}_{f_i \in F} D(p_{hist}|f_i(D_{hist};S_i^*))$$

$$\mathrm{s.t.}\ P(x<L) \leq \varepsilon_L\ \mathrm{AND}\ P(x>U) \leq \varepsilon_U$$

where $x \sim f_i(S_i^*)$
where $p_{hist}$ is the empirical probability distribution function of $D_{hist}$, $f_i(D_{hist}; S_i^*)$ is a corresponding probability of each value calculated by $f_i(S_i^*)$, and D ( ) is an entropy based divergence metric. L and U are modeled from the data, in an embodiment. In this formulation, a large number of probability distribution families are chosen. This differs from the traditional method of making an assumption of the probability distribution family from which data is being sampled from. The described modeling technique above results in a more realistic data set. Using the above methods and techniques, a distribution family $f_{field}(S_{field})$ is generated by the historical data modeler 120 for each field in the schema corresponding to network quality.

For each network parameter {app, geography, network type, time window}, corresponding sufficient statistics for probabilistic models of network parameters are generated by the sufficient statistic generator 124. For each network parameter, a sample value is selected from the probability distribution by the network parameter sampler 122. Independent data fields (e.g., network parameters) are sampled from relevant distributions, where $data_{ind} \sim f_{ind}(S_{ind})$. The network value tuple generator 126 creates a tuple based on the sampled network parameters. A tuple may be defined as latency, round trip time, and bandwidth, in one embodiment.

An application performance emulator 140 may also include a TCP and download outcome data gatherer 202, a data aggregator 204, a heuristics engine 206, a performance data store 208, a data analyzer 212, a performance inference generator 214, a data model generator 216, a VM generator 218, a network simulator 220, and a user device simulator 222 in one embodiment. A TCP and download outcome data gatherer 202 retrieves a generated TCP and download outcome based on emulated app performance, in an embodiment. Download outcomes include those download outcomes that are attempted to be optimized. TCP parameters are tuned via machine learning to positively affect download outcomes. Network parameters, in general, include both download outcomes and TCP parameters, as well as parameters which can be used to estimate network quality, such as round trip time. The TCP and download outcome data gatherer 202 may retrieve all network parameters, in an embodiment, that can be used to estimate network quality.

In one embodiment, for each tuple of a network parameters, as generated by the network value tuple generator 126, the download outcomes may be aggregated by a data aggregator 204 such that a total cost function may be computed to be used as a metric for user experience and application performance. A data aggregator 204 may aggregate data values over a fixed period of time (e.g., a month, a week, a day, etc.) for each combination of network type, geography, time window, time zone, etc., for a particular app. The performance of any application may then be evaluated under different conditions of network type, geography, time window, time zone, and so forth.

A heuristics engine 206 may incorporate knowledge known to administrators of the application performance emulator 140. A heuristic is a technique, method, or set of rules designed for solving a problem more quickly when classic methods are too slow, or for finding an approximate solution when classic methods fail to find any exact solution. Here, the heuristics engine 206 may incorporate knowledge known to the designers of the supervised learning method and techniques described herein to provide known dependencies, such as download outcome dependencies on other download outcomes and independent data. For example, a maximum throughput of 50 MB/sec may be known by administrators as an upper threshold. Thus, a transmission rate, a particular TCP parameter, may be throttled to a range of 20 to 30 MB/sec to ensure faster transmission and minimize the risk of packet loss.

A performance data store 208 is used to store performance data generated by the emulated application. For example, TCP and download outcome information may be captured for simulated user requests that were responded to by the application running on a virtual machine with a network simulator running on tuple parameters. This data may include rows of data generated from the virtual machine for any specified simulated period of time, such as hours, days, weeks, and months. The captured TCP and download outcome information are then stored in the performance data store 208. In this way, the performance of the app is measured based on the emulated application responses to generated data requests in the virtual machine. The performance data is then stored in the performance data store 208 for further analysis by the data analyzer 212, performance inference generator 214, and/or data model generator 216.

A data analyzer 212 may make comparisons of performance data as well as aggregated performance data to determine an app performance under various network conditions. For example, the data analyzer 212 may determine that an app has a baseline performance when faced with average network conditions (e.g., using a heuristic or domain knowledge provided by experts and/or administrators of the application performance emulator 140). One of the network values may be the number of cellular towers that operate a 3G network near Santa Rosa, Calif., for example. However, because network performance may fluctuate due to unforeseen circumstances, such as a disaster destroying cellular towers, a simulated wireless network may be generated using historical data from network traffic data after the wildfires in Napa and Sonoma counties. Captured TCP and download outcomes may be used as performance data under these extreme conditions. This performance data, in this example, may be stored in the performance data store 208 and retrieved for analysis by the data analyzer 212. Various statistical calculations, such as a moving average of download complete times over 24 hours, may be performed over performance data as well as aggregated performance data. Other comparisons may be made, such as comparing end user experience and application performance across different combinations of geography and network types, and further comparing algorithms and/or source code in different versions of an app. In this way, performance improvement or degradation in different iterations of the app may be viewed before moving to the next phase of application development, given the generative model and assumptions of the data generation process.

A performance inference generator 214 is used to determine an inference of performance under various network conditions based on the generated synthetic data matrix and statistical analysis of the computed download outcomes. Returning to the example above, an inference may be made that performance of all apps will have a 70% performance degradation, or perceived slowdown in performance by 70% based on the round trip time of apps being 70% slower, on average, under the network conditions modeled after the disastrous fires that impacted Santa Rosa, Calif. Other types of inferences may be made by the performance inference generator 214, such as the inferred performance of a transportation application in downtown San Francisco, Calif. at 5 pm on a weekday on the LTE network based on performance data gathered using a simulated wireless network operating under those network conditions. The inferred performance may include a percentage degradation, an analysis of download outcomes for various content types, and so forth. Here, the system is dynamically improved using inference techniques and the technology that is used to perform network transactions overall, as a client device may be configured with network parameters based on the inferred performance derived from emulating application performance. This improves network performance of that client device and thereby improves the user experience above and beyond previous approaches.

A data model generator 216 may generate one or more data models to estimate TCP parameters as described above. Given the possibility of network changes over time and the deterministic nature of identifying optimal TCP parameter values using synthetic data matrices, the data model generator 216 may be used to identify an iterative process for a supervised learning algorithm, such as methods and techniques used in the adaptive network performance optimizer 106, to train a machine to achieve desired outputs. Here, the estimation of the best value of a single parameter given the control fields using the performance information in the data points follows a two-step Bayesian learning algorithm. First, the estimation of the best value is based on a generative module where the TCP parameter is an inverse function of the download outcomes such as throughput, time to first byte, and download complete time. A prediction algorithm is used to estimate the optimal value of this parameter. In order to estimate a value close to optimum that works well in practice, the data points are weighted by a function of their performance information and the traffic share associated with the particular aggregation. In this way, a set of data points may be generated to train the machine as a result of the supervised learning methods and techniques of the adaptive network performance optimizer 106.

A VM generator 218 generates virtual machine instances for use in emulating application performance Using the tuple parameters generated by the network value tuple generator 126, a network simulator 220 may create a virtual network for the virtual machine to receives requests and issue responses. A user device simulator 222 may generate a simulated user device on the generated virtual machine instance such that one or more applications may be tested on the simulated user device for application performance emulation.

4. Emulating Application Performance with Simulated Wireless Networks

Figure 3:
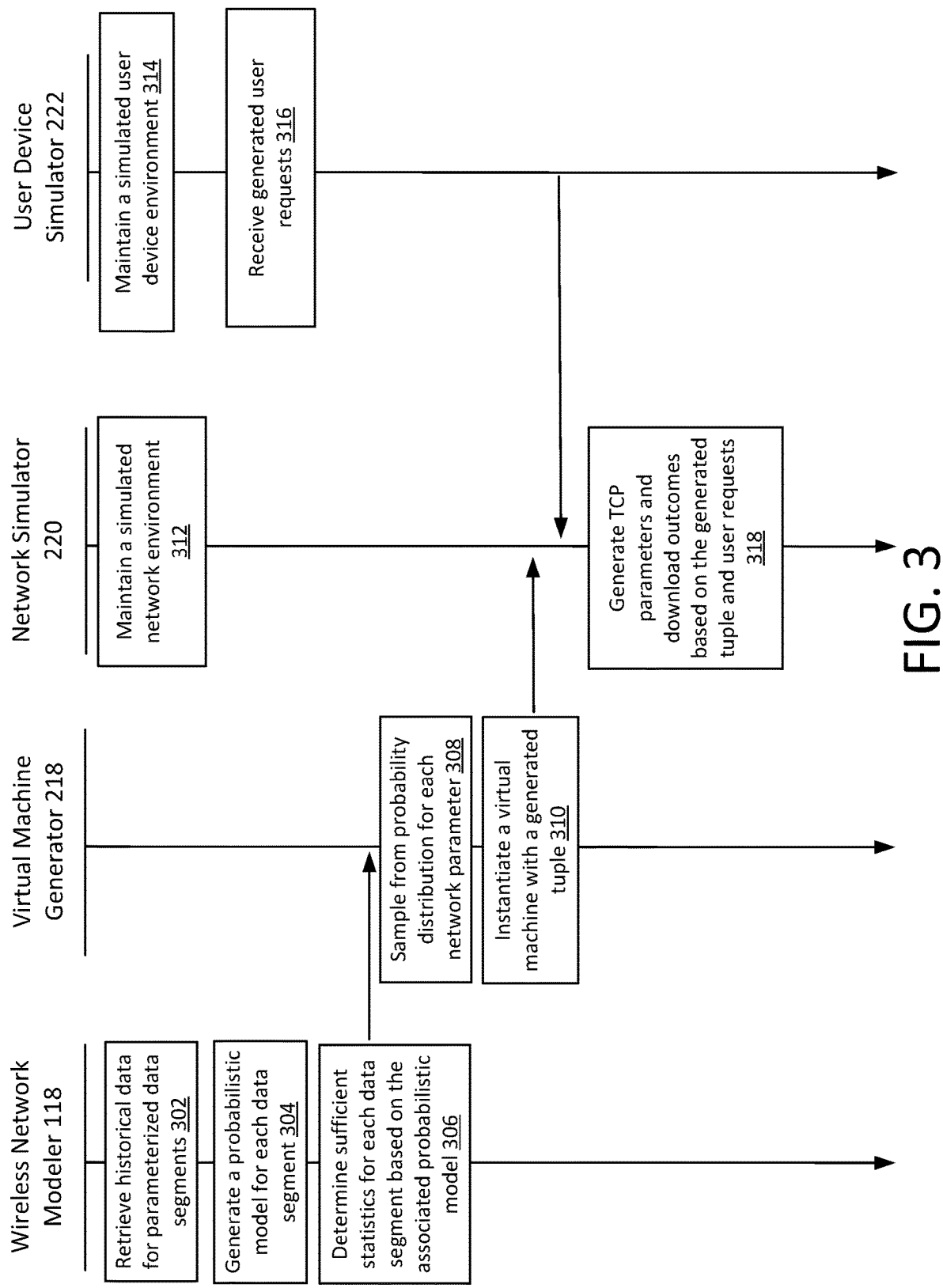
FIG. 3 illustrates a high-level interaction flow diagram of emulating performance of an application using a simulated wireless network, according to an embodiment of the invention.

FIG. 3 illustrates a high-level interaction diagram of emulating performance of an application using a simulated wireless network, according to an embodiment. A wireless network modeler 118 retrieves 302 historical data for parameterized data segments. Such historical data includes network traffic data values may include download outcomes that include download completion time, time to first byte, and throughput, for a set of network values, such as application, geography, network type, and time window. A probabilistic model is generated 304 for each data segment. The probabilistic model may include a set of probability distribution function families determined to fit the historical data.

Sufficient statistics are determined 306 for each data segment based on the associated probabilistic model. A virtual machine generator 218 is configured to receive the determined sufficient statistics for each data segment based on the associated probabilistic model. A value is sampled 308 from the probability distribution for each network parameter. A virtual machine is then instantiated 310 with a generated tuple.

A network simulator 220 maintains 312 a simulated network environment. Similarly, a user device simulator 22 maintains 314 a simulated user device environment. As the virtual machine is instantiated 310, it may operate on the network simulator with the generated tuple. The user device simulator 222 may receive generated user requests 316 of an application operating on the simulated user device operating on the virtual machine. The network simulator 220 may then generate 318 TCP parameters and download outcomes based on the generated tuple and user requests.

Figure 4:
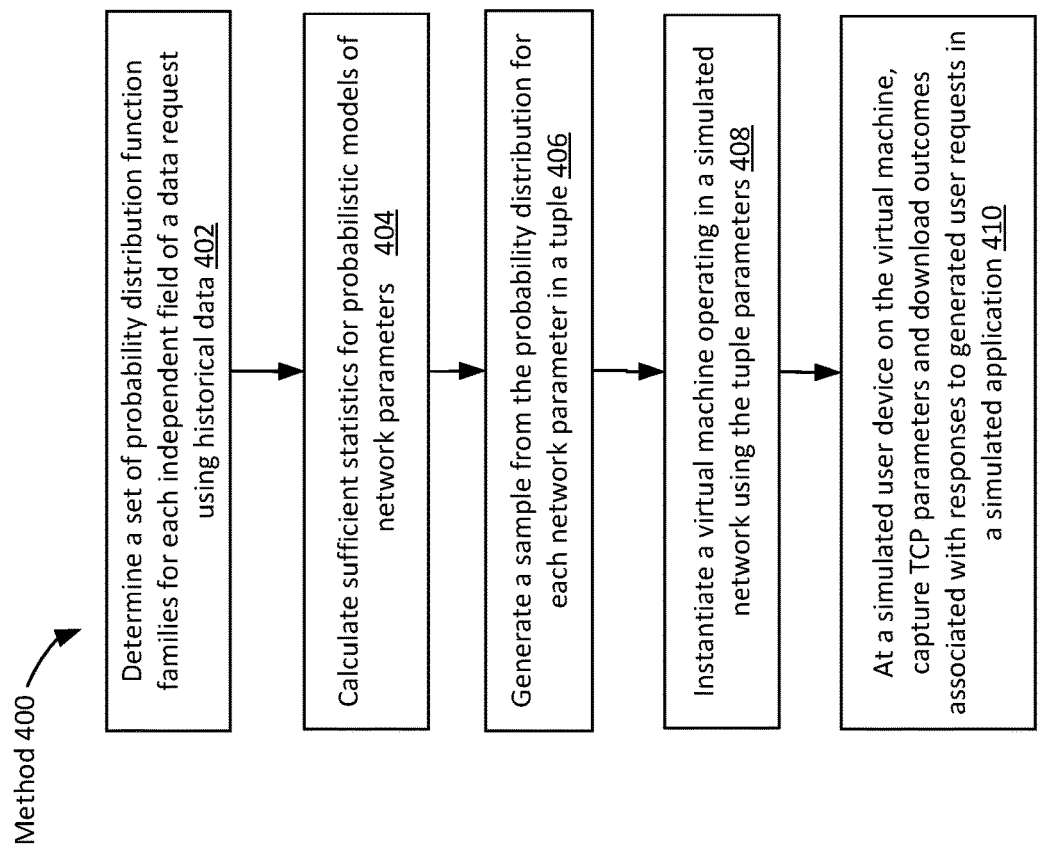
FIG. 4 illustrates a flowchart for application performance emulation, according to an embodiment of the invention.

FIG. 4 illustrates a flowchart for application performance emulation, according to an embodiment of the invention. Method 400, using the wireless network modeler 118, data aggregator 204, and data model generator 216, among other components in the system 100 as described above, may be used in application performance emulation, in an embodiment. A set of probability distribution function families is determined 402 for each independent field of a data request using historical data. A data request may include several independent fields, such as application name, network type, geography, and time window. A set of probability distribution function families is determined 402 for each independent field. For example, a set of fifty probability distribution function families may be determined for size. The probability distribution function families may be stored, in one embodiment, in a networked data store connected to the networks 210 (not pictured). In another embodiment, the set of probability distribution function families may be determined 402 for each independent field using historical data stored in the historical network traffic data store 112. A set of probability distribution function families are used to perform historical data modeling. For each individual field, sufficient statistics are calculated for each of the probability distribution family and the pair of (probability distribution family, sufficient statistics) which maximizes the likelihood of the data is chosen.

Sufficient statistics are calculated 404 for probabilistic models of network parameters. A statistic is sufficient for a family of probability distribution functions if the sample from which it is calculated gives no additional information than does the statistic as to which of those probability distributions is that of the population from which the sample was taken. A sufficient statistic summarizes the data or sufficiently represents a data set. An example of a sufficient statistic for a simple data set is a sample mean. As described above, other statistics may be calculated or determined to be sufficient or representative by administrators of the system 100, in some embodiments.

A sample is generated 406 from the probability distribution for each network parameter in a tuple. An optimal distribution family is generated for each network parameter as a probabilistic modeling of historical data for that network parameter. For example, a synthetic data distribution of network throughput speeds for 2 pm on a weekday in San Francisco, Calif. may be determined as an optimal distribution family and sufficient statistics as well as a priori constraints. Administrators may include domain expert knowledge to include upper and lower bounds, in an embodiment. A sample is generated 406 from the probability distribution generated from the historical data.

A virtual machine operating in a simulated network using the tuple parameters is instantiated 408. A virtual machine generator 218 may instantiate 408 the virtual machine operating in a simulate network using the network parameters sampled from the probability distribution. The virtual machine runs an application at a simulated user device operating on the virtual machine. At a simulated user device on the virtual machine, TCP parameters and download outcomes may be captured 410. The TCP parameters and download outcomes are associated with responses to generated user requests in a simulated application. In this way, application performance is emulated using a simulated wireless network based on probabilistic modeling of historical data.

Comparison of end user experience and mobile app performance across different combinations of geography and network type or algorithm/source code version may be achieved using method 400. A framework to compute metrics for app performance and end user experience may be generated based on the emulated app in the simulated wireless network.

Method 400 may also be used as a framework to use the emulated application operating on a simulated wireless network as control data in experimenting machine learning solutions for network optimization, in an embodiment. Given a tuple of app, network, and geography parameters, synthetic data may be generated as "bypass" traffic data, or un-optimized network traffic data. This bypass traffic data may be used as network request data to be used as a baseline for performance of a machine learning solution. Separately, a generative model may be used to probabilistically simulate download outcomes corresponding to accelerated network performance. For example, an adaptive network performance optimizer 106 may be used in conjunction with a generative model supplied by a data model generator 216 to probabilistically simulate download outcomes corresponding to accelerated network performance. The download outcome statistics of the bypass versus accelerated data may be compared to estimate performance of the adaptive network performance optimizer 106. New versions may be iterated based on the performance and new comparisons may be made by repeating method 400 with the new versions. In this way, emulated application performance directly improves the process of improving versions of the algorithm and/or source code.

The method 400 above allows more efficient analysis of system problems by using an emulated application performing on a simulated wireless network. This may enable automatic or operator-initiated modifications to system parameters that increases efficiency of the overall system performance, increases the efficiency of server and/or client computing performance, and aides in the systematic handling of problems that cause network performance issues from the viewpoint of the client device. For example, based on the generated inference of network performance based on the emulated application performance, network parameters for one or more applications may be configured based on the performance metrics generated to improve performance of the applications.

Characteristics of modern networks change at a very rapid clip. The diversity of devices, content, device types, access mediums, etc., further compound the volatility of the networks. These facets make the problem hard to characterize, estimate or constrain resulting in inefficient, slow and unpredictable delivery of any content over these networks. However, there is a lot of information about the network available in the transit traffic itself—from billions of devices consuming data. This information that describes network operating characteristics and defines efficacy of data delivery strategies is called a "network imprint". The approaches described herein allow embodiments to compute this network imprint. Embodiments include an apparatus comprising a processor and configured to perform any one of the foregoing methods. Embodiments include a computer readable storage medium, storing software instructions, which when executed by one or more processors cause performance of any one of the foregoing methods. Note that, although separate embodiments are discussed herein, any combination of embodiments and/or partial embodiments discussed herein may be combined to form further embodiments.

5. Implementation Mechanisms—Hardware Overview

According to one embodiment, the techniques described herein are implemented by one or more special-purpose computing devices. The special-purpose computing devices may be hard-wired to perform the techniques, or may include digital electronic devices such as one or more application-specific integrated circuits (ASICs) or field programmable gate arrays (FPGAs) that are persistently programmed to perform the techniques, or may include one or more general purpose hardware processors programmed to perform the techniques pursuant to program instructions in firmware, memory, other storage, or a combination. Such special-purpose computing devices may also combine custom hard-wired logic, ASICs, or FPGAs with custom programming to accomplish the techniques. The special-purpose computing devices may be desktop computer systems, portable computer systems, handheld devices, networking devices or any other device that incorporates hard-wired and/or program logic to implement the techniques.

Figure 5:
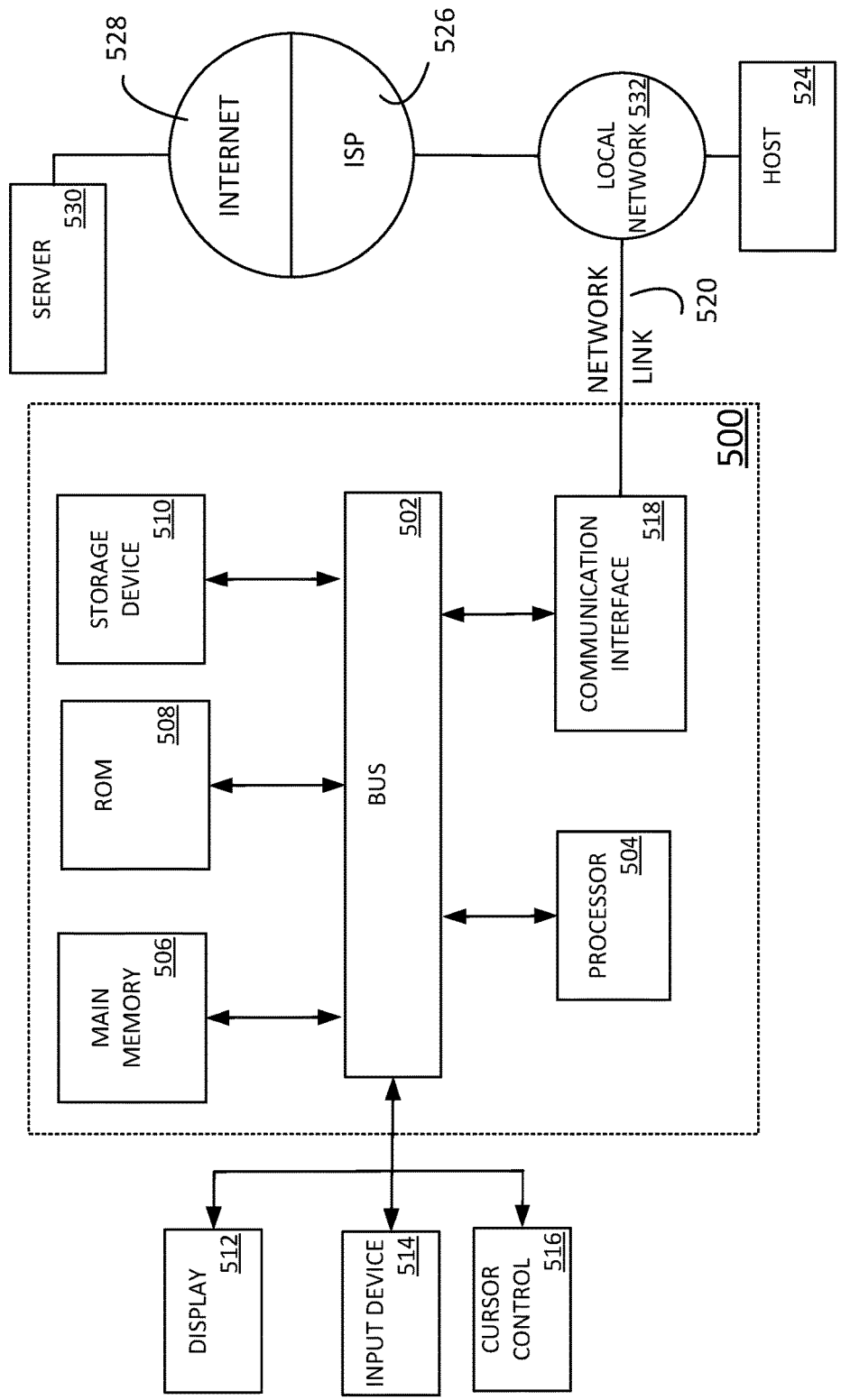
FIG. 5 illustrates an example hardware platform on which a computer or a computing device as described herein may be implemented.

For example, FIG. 5 is a block diagram that illustrates a computer system 500 upon which an embodiment of the invention may be implemented. Computer system 500 includes a bus 502 or other communication mechanism for communicating information, and a hardware processor 504 coupled with bus 502 for processing information. Hardware processor 504 may be, for example, a general purpose microprocessor.

Computer system 500 also includes a main memory 506, such as a random access memory (RAM) or other dynamic storage device, coupled to bus 502 for storing information and instructions to be executed by processor 504. Main memory 506 also may be used for storing temporary variables or other intermediate information during execution of instructions to be executed by processor 504. Such instructions, when stored in non-transitory storage media accessible to processor 504, render computer system 500 into a special-purpose machine that is device-specific to perform the operations specified in the instructions.

Computer system 500 further includes a read only memory (ROM) 508 or other static storage device coupled to bus 502 for storing static information and instructions for processor 504. A storage device 510, such as a magnetic disk or optical disk, is provided and coupled to bus 502 for storing information and instructions.

Computer system 500 may be coupled via bus 502 to a display 512, such as a liquid crystal display (LCD), for displaying information to a computer user. An input device 514, including alphanumeric and other keys, is coupled to bus 502 for communicating information and command selections to processor 504. Another type of user input device is cursor control 516, such as a mouse, a trackball, or cursor direction keys for communicating direction information and command selections to processor 504 and for controlling cursor movement on display 512. This input device typically has two degrees of freedom in two axes, a first axis (e.g., x) and a second axis (e.g., y), that allows the device to specify positions in a plane.

Computer system 500 may implement the techniques described herein using device-specific hard-wired logic, one or more ASICs or FPGAs, firmware and/or program logic which in combination with the computer system causes or programs computer system 500 to be a special-purpose machine. According to one embodiment, the techniques herein are performed by computer system 500 in response to processor 504 executing one or more sequences of one or more instructions contained in main memory 506. Such instructions may be read into main memory 506 from another storage medium, such as storage device 510. Execution of the sequences of instructions contained in main memory 506 causes processor 504 to perform the process steps described herein. In alternative embodiments, hard-wired circuitry may be used in place of or in combination with software instructions.

The term "storage media" as used herein refers to any non-transitory media that store data and/or instructions that cause a machine to operation in a specific fashion. Such storage media may comprise non-volatile media and/or volatile media. Non-volatile media includes, for example, optical or magnetic disks, such as storage device 510. Volatile media includes dynamic memory, such as main memory 506. Common forms of storage media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, and EPROM, a FLASH-EPROM, NVRAM, any other memory chip or cartridge.

Storage media is distinct from but may be used in conjunction with transmission media. Transmission media participates in transferring information between storage media. For example, transmission media includes coaxial cables, copper wire and fiber optics, including the wires that comprise bus 502. Transmission media can also take the form of acoustic or light waves, such as those generated during radio-wave and infra-red data communications.

Various forms of media may be involved in carrying one or more sequences of one or more instructions to processor 504 for execution. For example, the instructions may initially be carried on a magnetic disk or solid state drive of a remote computer. The remote computer can load the instructions into its dynamic memory and send the instructions over a telephone line using a modem. A modem local to computer system 500 can receive the data on the telephone line and use an infra-red transmitter to convert the data to an infra-red signal. An infra-red detector can receive the data carried in the infra-red signal and appropriate circuitry can place the data on bus 502. Bus 502 carries the data to main memory 506, from which processor 504 retrieves and executes the instructions. The instructions received by main memory 506 may optionally be stored on storage device 510 either before or after execution by processor 504.

Computer system 500 also includes a communication interface 518 coupled to bus 502. Communication interface 518 provides a two-way data communication coupling to a network link 520 that is connected to a local network 522. For example, communication interface 518 may be an integrated services digital network (ISDN) card, cable modem, satellite modem, or a modem to provide a data communication connection to a corresponding type of telephone line. As another example, communication interface 518 may be a local area network (LAN) card to provide a data communication connection to a compatible LAN. Wireless links may also be implemented. In any such implementation, communication interface 518 sends and receives electrical, electromagnetic or optical signals that carry digital data streams representing various types of information.

Network link 520 typically provides data communication through one or more networks to other data devices. For example, network link 520 may provide a connection through local network 522 to a host computer 524 or to data equipment operated by an Internet Service Provider (ISP) 526. ISP 526 in turn provides data communication services through the world wide packet data communication network now commonly referred to as the "Internet" 528. Local network 522 and Internet 528 both use electrical, electromagnetic or optical signals that carry digital data streams. The signals through the various networks and the signals on network link 520 and through communication interface 518, which carry the digital data to and from computer system 500, are example forms of transmission media.

Computer system 500 can send messages and receive data, including program code, through the network(s), network link 520 and communication interface 518. In the Internet example, a server 530 might transmit a requested code for an application program through Internet 528, ISP 526, local network 522 and communication interface 518.

The received code may be executed by processor 504 as it is received, and/or stored in storage device 510, or other non-volatile storage for later execution.

6. Equivalents, Extensions, Alternatives and Miscellaneous

In the foregoing specification, embodiments of the invention have been described with reference to numerous specific details that may vary from implementation to implementation. Thus, the sole and exclusive indicator of what is the invention, and is intended by the applicants to be the invention, is the set of claims that issue from this application, in the specific form in which such claims issue, including any subsequent correction. Any definitions expressly set forth herein for terms contained in such claims shall govern the meaning of such terms as used in the claims. Hence, no limitation, element, property, feature, advantage or attribute that is not expressly recited in a claim should limit the scope of such claim in any way. The specification and drawings are, accordingly, to be regarded in an illustrative rather than a restrictive sense.

What is claimed is:

1. A method, comprising:
   retrieving historical network traffic data from a historical network traffic data store, wherein the historical network traffic data is associated with one or more parameterized data segments of a network request;
   determining one or more representative statistics associated with a set of probability distribution function families associated with each parameterized data segment based on the historical network traffic data;
   determining an optimal distribution family from the set of probability distribution function families associated with each parameterized data segment comprising the one or more representative statistics;
   generating a tuple of network values based on sampling from the optimal distribution family associated with the network values;
   generating a virtual machine operating on a simulated network, the simulated network using the tuple of network values;
   causing operation of one or more applications on a simulated user device operating on the virtual machine;
   determining at least one network parameter from the operation of the one or more applications on the simulated user device;
   configuring the one or more applications based on the at least one network parameter to improve network performance of the one or more applications.

2. The method as recited in claim 1, further comprising generating an inference of performance based on the at least one network parameter.

3. The method as recited in claim 2, further comprising storing the inference of performance in a performance data store.

4. The method as recited in claim 1, further comprising:
   receiving generated user requests at the one or more applications on the simulated user device operating on the virtual machine;
   capturing at least one download outcome associated with a response to the generated user requests.

5. The method as recited in claim 4, further comprising:
   capturing Transmission Control Protocol (TCP) parameters associated with the response.

6. The method as recited in claim 1, wherein the parameterized data segments of a network request comprises one or more of an application, a network type, a geography, or a time window.

7. The method as recited in claim 1, further comprising:
   generating aggregate datasets of performance metrics comparing different combinations of network values of parameterized data segments that affect application performance based on the at least one network parameter from the operation of the one or more applications on the simulated user device.

8. One or more non-transitory computer-readable storage media, storing one or more sequences of instructions, which when executed by one or more processors cause performance of:
   retrieving historical network traffic data from a historical network traffic data store, wherein the historical network traffic data is associated with one or more parameterized data segments of a network request;
   determining one or more representative statistics associated with a set of probability distribution function families associated with each parameterized data segment based on the historical network traffic data;
   determining an optimal distribution family associated with each parameterized data segment comprising the one or more representative statistics;
   generating a tuple of network values based on sampling from the optimal distribution family associated with the network values;
   generating a virtual machine operating on a simulated network, the simulated network using the tuple of network values;
   causing operation of one or more applications on a simulated user device operating on the virtual machine;
   determining at least one network parameter from the operation of the one or more applications on the simulated user device;
   configuring the one or more applications based on the at least one network parameter to improve network performance of the one or more applications.

9. The one or more non-transitory computer-readable storage media as recited in claim 8, wherein the one or more sequences of instructions, which when executed by the one or more processors further cause performance of: generating an inference of performance based on the at least one network parameter.

10. The one or more non-transitory computer-readable storage media as recited in claim 9, wherein the one or more sequences of instructions, which when executed by the one or more processors further cause performance of:
    storing the inference of performance in a performance data store.

11. The one or more non-transitory computer-readable storage media as recited in claim 8, wherein the one or more sequences of instructions, which when executed by the one or more processors further cause performance of:
    receiving generated user requests at the one or more applications on the simulated user device operating on the virtual machine;

capturing at least one download outcome associated with a response to the generated user requests.

12. The one or more non-transitory computer-readable storage media as recited in claim 11, wherein the one or more sequences of instructions, which when executed by the one or more processors further cause performance of:

capturing Transmission Control Protocol (TCP) parameters associated with the response.

13. The one or more non-transitory computer-readable storage media as recited in claim 8, wherein the one or more sequences of instructions, which when executed by the one or more processors further cause performance of:

generating aggregate datasets of performance metrics comparing different combinations of network values of parameterized data segments that affect application performance based on the at least one network parameter from the operation of the one or more applications on the simulated user device.

14. An apparatus, comprising:

a network modeler, implemented at least partially in hardware, configured to retrieve historical network traffic data from a historical network traffic data store, wherein the historical network traffic data is associated with one or more parameterized data segments of a network request;

wherein the network modeler is further configured to determine one or more representative statistics associated with a set of probability distribution function families associated with each parameterized data segment based on the historical network traffic data;

wherein the network modeler is further configured to determine an optimal distribution family associated with each parameterized data segment comprising the one or more representative statistics;

a tuple generator, implemented at least partially in hardware, configured to generate a tuple of network values based on sampling from the optimal distribution family associated with the network values;

a virtual machine generator, implemented at least partially in hardware, configured to generate a virtual machine operating on a simulated network, the simulated network using the tuple of network values;

a user device simulator, implemented at least partially in hardware, configured to cause operation of one or more applications on a simulated user device operating on the virtual machine;

a data modeler, implemented at least partially in hardware, configured to determine at least one network parameter from the operation of the one or more applications on the simulated user device;

a network optimizer, implemented at least partially in hardware, configured to configure the one or more applications based on the at least one network parameter to improve network performance of the one or more applications.

15. The apparatus as recited in claim 14, further comprising a performance inference generator, implemented at least partially in hardware, configured to generate an inference of performance based on the at least one network parameter.

16. The apparatus as recited in claim 15, further comprising a data store, implemented at least partially in hardware, configured to store the inference of performance in a performance data store.

17. The apparatus as recited in claim 14, further comprising:

wherein the user device simulator is further configured to receive generated user requests at the one or more applications on the simulated user device operating on the virtual machine;

a network parameter sampler, implemented at least partially in hardware, configured to capture at least one download outcome associated with a response to the generated user requests.

18. The apparatus as recited in claim 17, wherein the network parameter sampler is further configured to capture Transmission Control Protocol (TCP) parameters associated with the response.

19. The apparatus as recited in claim 14, wherein the parameterized data segments of a network request comprises one or more of an application, a network type, a geography, or a time window.

20. The apparatus as recited in claim 14, further comprising a data aggregator, implemented at least partially in hardware, configured to generate aggregate datasets of performance metrics comparing different combinations of network values of parameterized data segments that affect application performance based on the at least one network parameter from the operation of the one or more applications on the simulated user device.

* * * * *